United States Patent
Li

(10) Patent No.: US 7,227,783 B2
(45) Date of Patent: Jun. 5, 2007

(54) MEMORY STRUCTURE AND METHOD OF PROGRAMMING

(75) Inventor: Chi Nan Brian Li, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 79 days.

(21) Appl. No.: 11/116,614

(22) Filed: Apr. 28, 2005

(65) Prior Publication Data

US 2006/0245262 A1   Nov. 2, 2006

(51) Int. Cl.
G11C 11/34 (2006.01)

(52) U.S. Cl. .......................... 365/185.18; 365/185.19; 365/185.22; 365/185.25

(58) Field of Classification Search ........... 365/185.18, 365/185.19, 185.22, 185.27
See application file for complete search history.

(56) References Cited

U.S. PATENT DOCUMENTS

| | | | |
|---|---|---|---|
| 5,991,201 A * | 11/1999 | Kuo et al. ............. | 365/185.22 |
| 6,046,932 A | 4/2000 | Bill et al. | |
| 6,275,415 B1 | 8/2001 | Haddad et al. | |
| 6,714,448 B2 * | 3/2004 | Manea .................. | 365/185.22 |
| 6,747,901 B2 * | 6/2004 | Hirano .................. | 365/185.18 |
| 6,882,567 B1 * | 4/2005 | Wong .................... | 365/185.22 |
| 6,903,972 B2 * | 6/2005 | Lasser et al. .......... | 365/185.18 |
| 6,909,638 B2 * | 6/2005 | Choy et al. ............ | 365/185.18 |
| 7,042,766 B1 * | 5/2006 | Wang et al. ........... | 365/185.22 |
| 2004/0218421 A1 | 11/2004 | Choy et al. | |

OTHER PUBLICATIONS

Bude, J.D. et al. ; "EEPROM/Flash Sub 3.0V Drain-Source Bias Hot Carrier Writing"; IEDM; 1995; pp. 3.7.1-3.7.3; IEEE; USA.

* cited by examiner

Primary Examiner—Trong Phan
(74) Attorney, Agent, or Firm—Kim-Marie Vo

(57) ABSTRACT

A memory and a method for programming a memory device are discussed. The method comprises selecting a cell to program, wherein the cell is coupled to a bit line, applying a first programming pulse, wherein the first programming pulse comprises applying a first voltage to the bit line, verifying if the cell is programmed after applying the first programming pulse, and applying a second programming pulse to the bit line after applying the first programming pulse if the cell is not programmed after applying the first programming pulse, wherein second programming pulse comprises applying a second voltage to the bit line, wherein the second voltage is different than the first voltage.

9 Claims, 4 Drawing Sheets

MEMORY STRUCTURE AND METHOD OF PROGRAMMING

FIELD OF THE INVENTION

This invention relates generally to semiconductor devices, and more specifically, to memory devices, such as non volatile memory devices.

BACKGROUND

To increase their speed of operation, devices are continuously scaled. For example, channel lengths of floating gate based non volatile memory devices are decreased. Because programming voltages remain unchanged, short channel behaviors become problematic during programming when the channel lengths decrease. Typically, to program a selected device, a high drain voltage ($V_d$) is applied to the bit line of the selected device and a gate voltage ($V_g$) is applied to a word lines. Since other devices that are not to be programmed (unselected devices) are also coupled to the bit line of the selected device but the word line they are coupled to has a $V_g$ of zero, the unselected devices experience Drain Induced Barrier Lowering (DIBL). DIBL lowers the threshold voltage ($V_t$) of the unselected devices and introduces high column leakage during programming in which a high $V_d$ is applied to the selected bit line.

In addition, when on volatile memory devices are scaled the thickness of a tunnel oxide is decreased. This decrease in oxide thickness increases read disturb or Low Temperature Date Retention (LTDR) from a low $V_t$ state. One solution to reduce LTDR is to reduce the natural ultraviolet $V_t$ of the device. However, the short channel effects, such as DIBL are more severe when the natural ultraviolet $V_t$ is decreased. Thus, column leakage becomes larger, which negatively impacts programming efficiency and time.

Thus, a need exists for a programming scheme that reduces LTDR and does not decrease programming efficiency.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Instead of changing the device dimensions to avoid DIBL, the programming process is changed. A multi-step programming process is used to solve the DIBL effect and to maintain programming efficiency. In one embodiment, the programming pulses of the different steps are different in that the well voltage and drain voltage applied in each step have different values. In other embodiments, the programming pulses are different because the gate voltage, drain voltage, source voltage, well voltage, or combinations of the above have different values in each step of the programming process.

Figure 1:
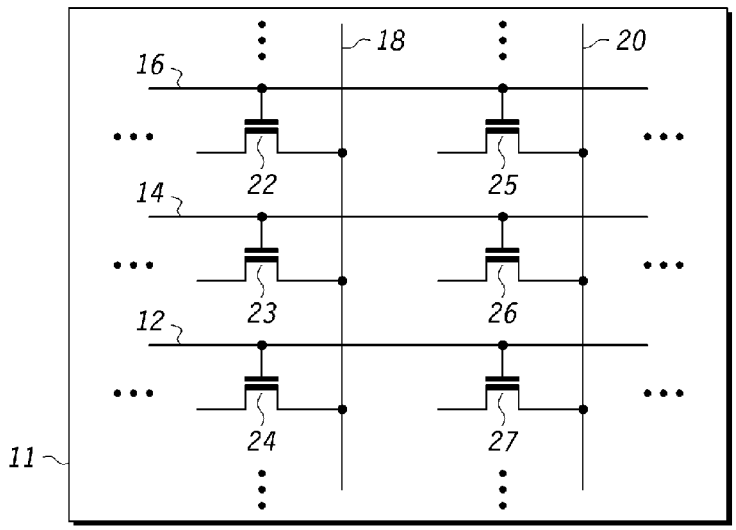
FIG. 1 illustrates a portion of a memory array that can be used to program in accordance with an embodiment of the present invention.

FIG. 1 illustrates an exemplary portion of a memory cell array 10. The memory cell array 10 includes cells or devices 22–27. Each of the cells 22–24 has a drain coupled to a bit line 18 and each of the cells 25–27 has a drain coupled to bit line 20. The gate of each of the cells 22 and 25 is coupled to word line 16, the gate of each of the cells 23 and 26 is coupled to word line 14, and the gate of each of the cells 24 and 27 is coupled to word line 12. The source for each of the cells 22–27 is coupled to ground. The memory cell array 10 includes well 11, in one embodiment.

If prior art methods are used to program the cell 23, for example, there will be high current leakage in cells 22 and 24. For example, to program cell 23 using traditional methods a voltage is applied to bit line 18 and a voltage is applied to the word line 14. No voltage is applied to word lines 12 and 16 so the voltage on these word lines is equal to zero. Since cells 22 and 24 are coupled via their drains to bit line 18 and the word lines 12 and have no voltage applied, cells 22 and 24 will experience a DIBL. The DIBL effect lowers the erased threshold voltage for the cells and introduces high column leakage during programming, pulling down the voltage on bit line 18.

To avoid the problems of the prior art, a multi-step programming approach is used to program cell 23. Any number of programming steps may be used. In one embodiment, the multi-step programming approach includes two programming steps. The first step applies a first programming pulse that achieves a high program speed and the second programming pulse will program any erratic bits that experience DIBL. The second (and optional additional) programming pulse does not impact the overall programming speed in the array. If more than two programming steps are performed, the additional programming step (e.g., 3, 4, 5,etc.) will be similar to the second programming pulse and will serve the same function as the second programming pulse. The programming of cell 23 can be better understood by referring to the flow chart in FIG. 2.

Figure 2:
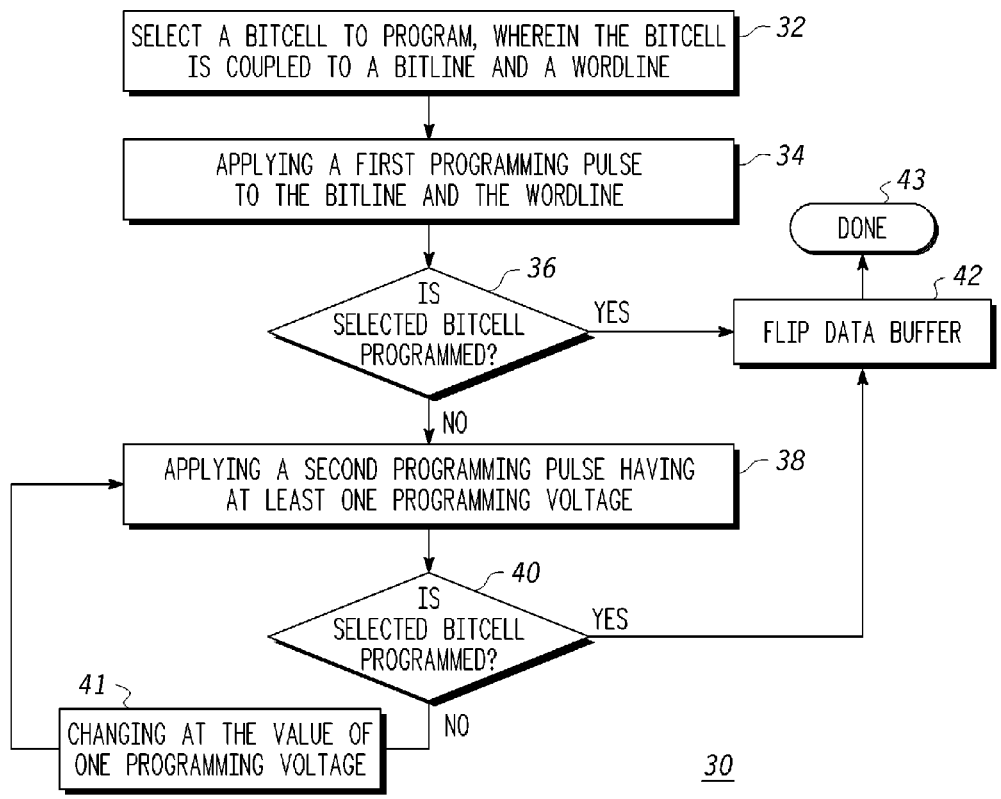
FIG. 2 illustrates a flow chart of a method that can be used to program a cell, such as a cell in FIG. 1, in accordance with an embodiment of the present invention.

Shown in FIG. 2 is a flow chart of a method 30 for operating a memory, such as memory 10 in FIG. 1, to achieve effective programming including the steps 32, 34, 36, 38, 40, 41, 42, and 43. First, a cell or device to be programmed is selected, wherein the cell is coupled in step 32 to a bit line and a word line. For example, cell 23 in FIG. 1 may be selected to be programmed. (While in reality many cells will be programmed simultaneously, programming only one cell is described for simplicity.) After the cell 23 is selected in step 32, a first programming pulse is applied in step 34 to the bit line and the word line. In one embodiment, the first programming pulse is also provided to the gate and the well 11 (FIG. 1) of the cell. In one embodiment, the first programming pulse is a pulse used for hot carrier injection (HCI) programming. For example, the gate voltage ($V_g$) may be from 5 to 10 V, such as 8.5 V; the drain voltage ($V_d$) may be from 4 to 5 V, the source voltage (Vs) and the well voltage ($V_{well}$) may be from 0 to −2 V. These voltages are likely to decrease as semiconductor technology improvements continue to result in smaller and smaller dimensions for channel lengths and gate dielectrics. By using HCI programming voltages high program speed can be achieved for the cells that are programmed by this step (without the additional programming step). The majority of cells in the array should be programmable using just HCI programming voltages.

After the first programming pulse is applied in step 34, verification occurs to determine in step 36 if the selected cell is programmed. A sense amplifier may be used to detect the state of cell 23 and a control circuit may be used to determine if the programming of cell 23 was sufficient. If the selected cell is programmed then the data buffer is flipped in step 42 and the method is done in step 43. If the selected cell is programmed after applying the first programming pulse then the DIBL effect for this bit line is nonexistent or minimal. However, if the DIBL effect for this bit line affects programming, the cell will not be programmed.

If the selected cell is not programmed, a second programming pulse is applied in step 38 to the bit line and the word line, wherein at least one programming voltage is different than the first programming pulse. The second programming pulse is a low program speed process that is used to program a cell that resides in a bit line that comprises erratic cells that have erratically smaller channel lengths than the average cells. The cells may have erratically smaller channel lengths because the lengths may vary due to processing variation. Since only a few cells will require this second programming pulse, the overall programming speed is not affected. In one embodiment, the different programming voltage is applied to the source, drain, gate, well, or any combinations of the above. In one embodiment, the programming voltages during the second programming pulse are all different than the programming voltage of the first programming pulse; hence, the programming voltage may be different for the source, drain, gate, and well. In the embodiment where the first programming pulse applied a programming voltage to the source, drain, gate and well using HCI programming conditions ($V_g$=8.5, $V_d$=5, $V_s$=0, and $V^{well}$=0 to −0.5), the second programming pulse conditions may be set so that a higher well potential is applied and the drain voltage is dropped so that column leakage is cut off. For example, the second programming pulse conditions may be $V_g$=8.5V, $V_s$=0, $V_d$=3.3V and $V_{well}$−1.5V so that secondary electron injection with a well bias is used. These voltages are likely to decrease as semiconductor technology improvements continue to result in smaller and smaller dimensions for channel lengths and gate dielectrics. In one embodiment, the second programming pulse of the source voltage, the drain voltage, or both can be decreased using resistors, as will be described in regards to FIG. 6.

As will be understood afterfurther explanation, method 30 includes a repetitive process. As will be described in regards to FIG. 7, using resistors to decrease the voltage is one way to determine when to stop applying programming pulses even if the selected cell is not programmed. Alternatively, other methods can be used to end the method in case the cell is never programmed. For example, a predetermined time or number of cycles can be set. If these conditions are not met, the method could skip to the done step 43 to avoid a never ending process.

After applying in step 38 a second programming pulse, verification occurs to determine in step 40 if the selected cell is programmed. If the cell is programmed, the data buffer is flipped in step 42 and the method is done in step 43.

If, instead, the cell is not programmed, then the value of at least one of the programming voltages of the second programming pulse is changed in step 41. After changing in step 41 a value of at least one programming voltage of the second programming pulse, the steps of applying in step 38 a second programming pulse and verifying in step 40 if the selected cell is programmed are repeated. Thus, each time a programming step is performed the at least one programming voltage changes relative to the previous programming step. For example, the drain voltage may decrease, the well voltage may become more negative (decrease), the source voltage may increase, the gate voltage may increase, or any combinations of the above. Shown in FIGS. 3–5 are graphs of how different voltage may change during each programming step.

Figure 3:
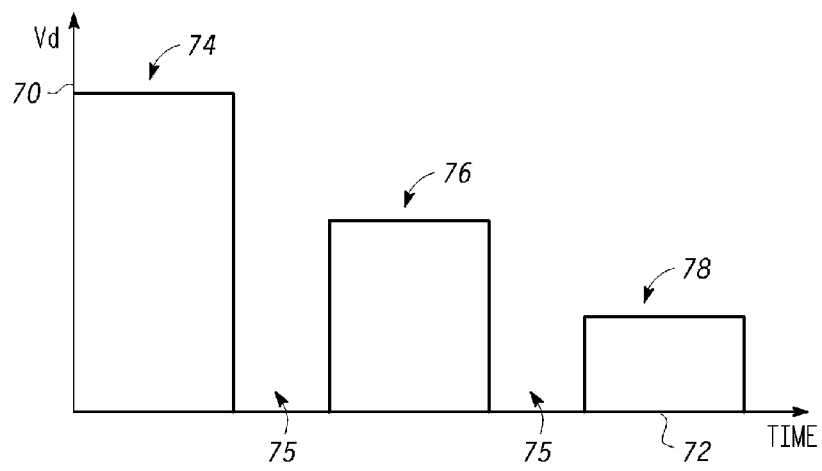
FIGS. 3–5 illustrate how various voltages may change during different programming pulses in accordance with embodiments of the present invention.

FIG. 3 illustrates how the drain voltage may change, if any, during programming. Y-axis 70 is the drain voltage ($V_d$) in Volts and X-axis 72 is time. Element 74 is the first programming pulse, element 76 is the second programming pulse, and element 78 is the third programming pulse. While any number of programming pulses may be performed, three are shown as an example. Between each programming pulse is verification 75. If the drain voltage value is changed for the different programming pulses, the value should decrease with each programming pulse. In one embodiment, the first programming pulse 74 is 4.5 to 5.5 V, the second programming pulse 76 is 4 to 4.5 V, and the third programming pulse 78 is 3.5 to 4 V. The decreasing drain voltage is to reduce column leakage in the subsequent program pulses. Decreasing the drain voltage avoids the junction breakdown that typically occurs at 6–7 Volts.

Figure 4:
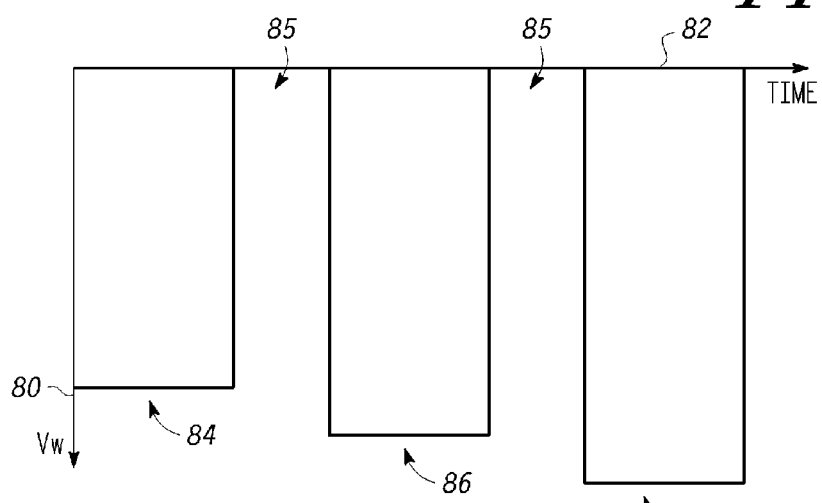

FIG. 4 illustrates how the well voltage may change, if any, during programming. Y-axis 80 is the well voltage ($V_w$) in Volts and X-axis 82 is time. Because the well voltage is negative, the Y-axis is only shown in the negative direction. Element 84 is the first programming pulse, element 86 is the second programming pulse, and element 88 is the third programming pulse. While any number of programming pulses may be performed, three are shown as an example. Between each programming pulse is verification 85. If the well voltage value is changed for the different programming pulses, the value should decrease (get more negative, even though the absolute value of the voltage is increasing) with each programming pulse. In one embodiment, the first programming pulse 84 is 0 to −0.5 V, the second programming pulse 86 is −0.5 to −1 V, and the third programming pulse 88 is −1 to −2 V. The well voltage at some point will eventually stabilize because any increase in the well voltage will increase the junction breakdown. However, just because the well voltage should not be increased anymore doesn't mean the programming pulses stop. The well voltage can stop increasing, but the other voltages, such as the gate voltage, can change. Therefore, in the method 50 of FIG. 7 (which will be described in detail below) the well voltage may stop increases before the final count in step 62 is reached. In one embodiment, the well voltage will stabilize at −2 V. The increasing magnitude (absolute value) of the well voltage decrease column leakage as programming pulses are applied.

Figure 5:
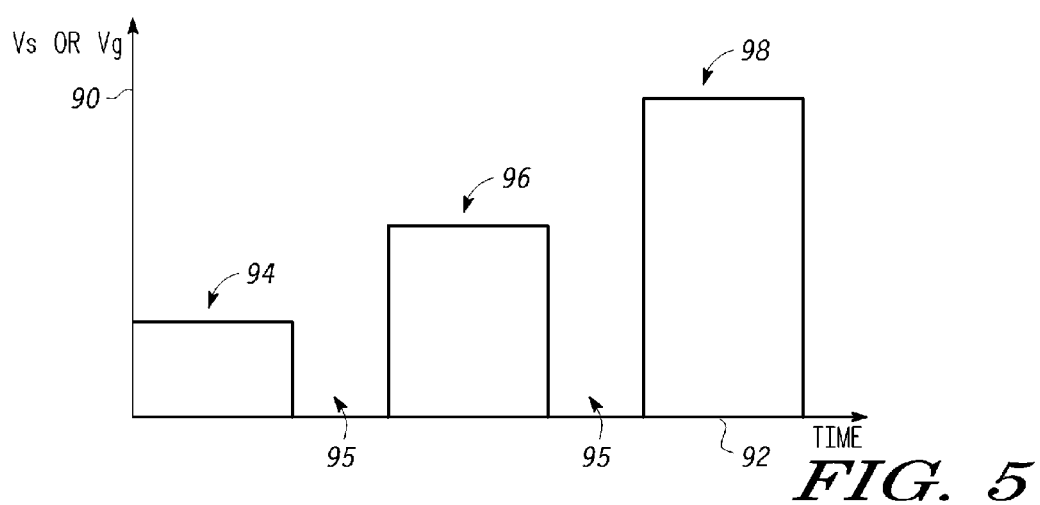

FIG. 5 illustrates how the source or gate voltage may change, if any, during programming. Y-axis 90 is either the source voltage ($V_s$) in Volts or the gate voltage ($V_g$) in Volts, and X-axis 92 is time. Element 94 is the first programming pulse, element 96 is the second programming pulse, and element 98 is the third programming pulse. While any number of programming pulses may be performed, three are shown as an example. Between each programming pulse is verification 95. If the gate voltage or the source voltage value is changed for the different programming pulses, the value should increase with each programming pulse. In one embodiment for the source voltage, the first programming pulse 94 is 0 to 0.5 V, the second programming pulse 96 is 0.5 to 1 V, and the third programming pulse 98 is 1 to 1.5 V. In one embodiment for the gate voltage, the first programming pulse 94 is 7 to 8 V, the second programming pulse 96 is 8 to 8.5 V, and the third programming pulse 98 is 8.5 to 9.5 V. The increasing magnitude of the source voltage decrease column leakage as programming pulses are applied, just like the well voltage. The increasing gate voltage compensates for the loss in program speed that occurs from changing the source voltage, the well voltage, the drain voltage, and combinations of these voltages.

Figure 6:
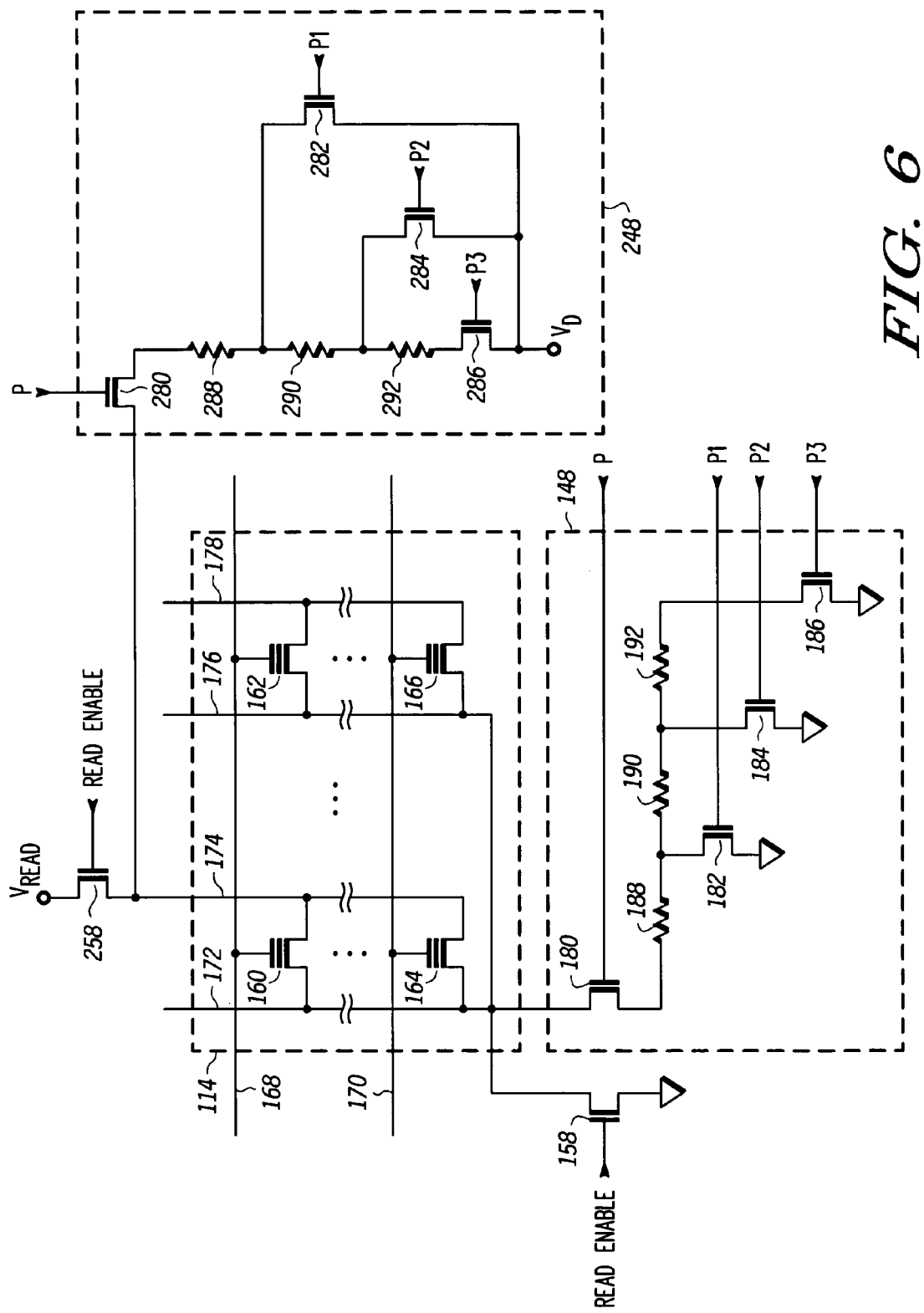
FIG. 6 illustrates a portion of a circuit in accordance with an embodiment of the present invention.

Shown in FIG. 6 is a portion of a memory in accordance with one embodiment of the present invention. This embodiment includes resistors to be used to change the programming pulses. More specifically, the resistors may be used to change the voltage of the drain, source, or both. In particular a portion of I/O block 114, source control circuit 148, first transistor 158, drain control circuit 248, and second transistor 258 are shown in FIG. 3. The portion of the I/O block comprises memory cells 160, 162, 164, and 166; bit lines 174 and 178; and source lines 172 and 176. Source control circuit 148 comprises transistors 180, 182, 184, and 186 and resistors 188, 190, and 192. Drain control circuit 248 comprises transistors 280, 282, 284, and 286 and resistors 288, 290, and 292. The drains of memory cells 160 and 164 are connected to bit line 174. The drains of memory cells 162 and 166 are connected to bit line 178. The sources of memory cells 160 and 164 are connected to source line 172. The sources of memory cells 162 and 166 are connected to source line 176. The control gates of memory cells 160 and 162 are connected to word line 168. The control gates of memory cells 164 and 166 are connected word line 170. In one embodiment, source lines 172 and 176 are connected together. I/O block 114 has a common well for the devices within the block 114 so that if the well voltage changes for one of the cells in the I/O block 114, it changes for all the cells in the I/O block 114.

In further describing FIG. 6, transistor 180 has a drain connected to source lines 172 and 176, a gate connected to a program signal P, and a source. Resistor 188 has a first terminal connected to the source of transistor 180 and a second terminal. Transistor 182 has drain connected to the second terminal of resistor 188, a source connected to ground, and a gate for receiving a program signal P1. Resistor 190 has a first terminal connected the second terminal of resistor 188 and a second terminal. Transistor 184 has a drain connected to the second terminal of resistor 190, a source connected to ground, and a gate for receiving a program signal P2. Resistor 192 has a first terminal connected to the second terminal of resistor 190 and a second terminal. Transistor 186 has a drain connected to the second terminal of resistor 192, a source connected to ground, and a gate for receiving a program signal P3. Transistor 158 has a drain connected to source lines 172 and 176, a source connected to ground, and a gate for receiving a READ ENABLE signal. Transistor 158 is a representative one of many transistors that are part of an array connected to source lines at other locations in memory array for coupling the source lines to ground during a read operation of memory. The READ ENABLE signal and signals P, P1, P2, and P3 are generated by a control circuit (not shown).

Transistor 280 has a drain connected to bit lines 174 and 178 through decoder circuit block 281, a gate connected to a program signal P, and a source. Resistor 288 has a first terminal connected to the source of transistor 280 and a second terminal. Transistor 282 has drain connected to the second terminal of resistor 288, a source connected to $V_D$, and a gate for receiving a program signal P1. Resistor 290 has a first terminal connected the second terminal of resistor 288 and a second terminal. Transistor 284 has a drain connected to the second terminal of resistor 290, a source connected to $V_D$, and a gate for receiving a program signal P2. Resistor 292 has a first terminal connected to the second terminal of resistor 290 and a second terminal. Transistor 286 has a drain connected to the second terminal of resistor 292, a source connected to $V_D$, and a gate for receiving a program signal P3. Transistor 258 has a drain connected to bit lines 174 and 178, a source connected to $V_D$, and a gate for receiving a READ ENABLE signal. Transistor 258 is a representative one of many transistors that are part of an array connected to bit lines at other locations in memory array for coupling the drain lines to $V_{read}$ during a read operation of memory. The READ ENABLE signal and signals P, P1, P2, and P3 are generated by a control circuit (not shown).

In the embodiment illustrated in FIG. 6, source control circuit 148 and drain control circuit 248 are similar because they each use three resistors. However, any number of resistors can be used. And the number of resistors that are used by source control circuit 148 and drain control circuit 248 need not be the same. In addition, only the source control circuit 148 or drain control circuit 248 may be used. Furthermore, FIG. 6 is only an example of one method that can be used. Any other method for applying voltages for the source and drain may be used.

Figure 7:
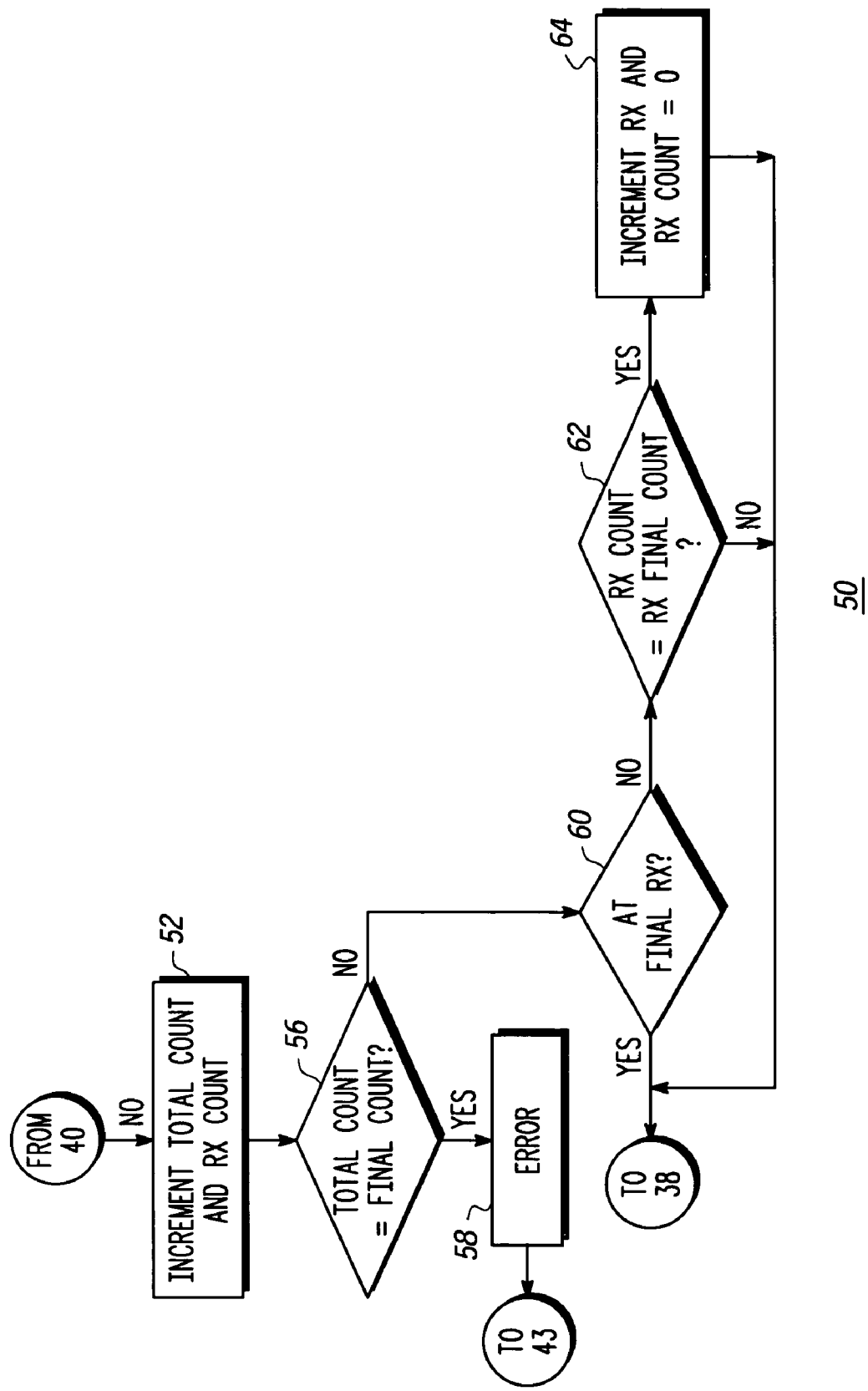
FIG. 7 illustrates a flow chart of a method that can be used in conjunction with the method of FIG. 2 to program the circuit of FIG. 6 in accordance with an embodiment of the present invention.

Shown in FIG. 7 is a flow chart of a portion of a method 50 for operating the memory of FIG. 3 to achieve effective programming comprising steps 52, 56, 58, 60, 62, and 64. In one embodiment, the method 50 can be used in the method 30 of FIG. 2. Method 50 is one embodiment of step 41 of FIG. 2 (changing 41 the value of the programming voltage). As shown in FIG. 4 the method 50 can be combined with the method 30 of FIG. 2 by having method 30 be step 41 so that step 52 follows step 40 if it is found in step 40 that the selected cell is not programmed. For completeness, the combination of the method 30 and 50 will be discussed in regards to operating the memory of FIG. 6.

As shown in step 32 of FIG. 2, the process begins by selecting a cell to be programmed and initializing certain settings. Then a first programming pulse is applied 34 to the cell, as discussed in regards to FIG. 2. Next, the verification 36 is performed to determine if the selected cell is programmed. If it the cell is programmed, the data buffer is flipped 42 and the process is then done 34.

If the cell is not programmed, a second programming pulse is performed 38. Before performing the second programming pulse, the total number of times (cycles) the second programming pulse is initially set. Because no cycles have yet been performed the Total Count is set to 0 (zero). In this process, multiple programming cycles will use different resistances that may be incremented in steps so that each step in resistance is designated $R_x$. In the embodiment described in detail $R_x$ will be $R_d$ but $R_x$ could also be $R_s$ as will be explained in more detail further below. Thus, although this process is being described with respect to changing the drain voltage using the drain control circuit 248, the same process can be used for the source voltage using the drain control circuit 248.)

The first resistance to be used is set so $R_d=1$ is the initial setting for $R_d$. Also there will be a set number of maximum programming cycles for each resistance step. At the beginning there have been no programming cycles for any steps including the first step so that $R_d$ Count=0 as the initial setting. In actual operation, simultaneously with one cell being selected for programming many other cells will also be selected, typically one cell from each of the I/O blocks, and in this case, as many as 64. Of the 64, only those that are being changed from the erase state are programmed. Thus, many cells of the 64 are likely to be intended to stay in the erased state, typically considered the one (1) state as distinct from the programmed stated being considered the zero (0) state. Also, some of the cells that are intended to be in the "0" state may already be in that state. Thus, for any given programming cycle, the actually programming can be anywhere from no memory cells to 64 memory cells. The case of none being programmed occurs when all of the cells were already in the condition that was to be written. The condition of all 64 cells being programmed occurs when all of the memory cells were in the erased (one) state and an all zeros condition is to be written.

After it has been determined that the particular cell, such as cell 160 of FIG. 6, needs to be programmed and the initial conditions are set, a second programming pulse is applied to the drain, via bit line 174, of that cell while its gate, via word line 168, is also at an elevated voltage. The voltages previously discussed in regards to step 38 of FIG. 2 may be used. During the application of the pulse to bit line 174, transistors 284 and 286 are non-conductive. Conventional control logic (not shown) supplies signals P and P1 in the drain control circuit 248 at a logic high and signals P2 and P3 in the drain control circuit 248 at a logic low under these initial conditions. The READ ENABLE signal 258 is held at a logic low for programming so that the transistor 258 is non-conductive during programming. This has the effect of the resistor 288 being in series with the sources of the entire array. Resistor 288 has a relatively low resistance, e.g., 250 ohms, so that relatively little voltage is dropped across this resistors and thereby not greatly elevating the source or drain voltage. This is effective for fully programming memory cell if the other memory cells connected to bit line 274 do not have too much leakage. If the other cells, such as memory cell 164, do have significant leakage, that will have the effect of reducing the voltage applied to bit line 174 because of the loading of the power supply and of the parasitic resistance that is associated with I/O block 114.

The next step then, step 40 of FIG. 2, is to determine if cell 160 has been programmed. A sense amplifier (not shown), under a control of source control circuit 148 detects the state of cell 160 so that source control circuit 148 can determine if the programming of cell 160 was sufficient. If it was, then data is flipped in data buffer as shown in step 42, and the programming is done as shown in step 43. If, on the other hand, cell 160 is not considered to be programmed, the total count is incremented and the $R_d$ count is incremented as shown in step 52 of FIG. 7.

Next, the total count of program cycles, step 56, is compared to the maximum allowed number of program cycles. Of course, the first time the criterion of this step 56 is addressed it will not be met, so the answer is no, and the next step would be step 60. If, after additional programming cycles, this criterion of step 56 is met, then that is considered an error 58 and programming cycle is done 43. If this were to be done at the test level before the product was actually sold, this would be considered a failure and the device would be rejected. Conventional control logic (not shown) has all the information necessary for making this decision.

For the case in which the criterion of step 56 is not met, there is then performed a determination if the present $R_d$ is the last $R_d$, as shown in step 60. If it is the last $R_d$, then the next step is to perform another second programming pulse by going to step 38. If the present $R_d$ is not the last step, then the next step, step 62, is to determine if the maximum number of steps at that $R_d$ level has been performed. In this case of the first time addressing this issue, the first step is likely to be the only step which uses the first resistance step, the resistance of resistor 288. Thus the number of programming steps at $R_d$=1 is likely to be just one. Thus, the $R_d$ Count of 1 would match the $R_d$ Final number, likely to be one. In such case the next step is step 64. In other circumstances where the number of programming steps at that $R_d$ level had not been reached, the next step would be to repeat step 38 of applying a second programming pulse to the bit line of the selected cell.

Thus, if the $R_d$ count matches the $R_d$ final number, step 64 is performed to increment $R_d$ and move to the next $R_d$. With this step of incrementing, $R_d$=2 is performed and the $R_d$ Count is set to zero. With $R_d$=2, the effect is for signals P and P2 in the drain control circuit 248 to be at a logic high and signals P1 and P3 in the drain control circuit 248 to be at a logic low. The drain resistance (in this context drain resistance is the resistance that is coupled to the commonly-connected drain of the transistors in the memory array) is thus made to be that of resistor 290 plus that of resistor 288. Resistor 290 is preferably significantly more resistive than resistor 288, e.g., 2000 ohms. The resistance of resistor 290 is designed to provide sufficient resistance to raise the drain voltage so that the typical low threshold voltage devices on bit line 174 are made non-conductive during programming. If the cell was not programmed on the first attempt, it is assumed that there are then low threshold voltage transistors on bit line 174 that provided sufficient current leakage to prevent cell 160 from being successfully programmed. After performing a programming step at $R_d$=2, the next step is to determine if it was successfully programmed. If so, the data is flipped in data buffer 30 and the programming of this cell 160 is completed.

If cell 160 is not sufficiently programmed, then the total programming count is compared to the final count maximum. If yes, then this is considered an error and the device is rejected if at the test level. If the total programming count has not been reached, the next step is to determine if the $R_d$ is at the last level. If so, then the next step is to repeat the second programming pulse step 38 at that $R_d$. If no, then the next step is to determine if the maximum number of programming steps at that $R_d$ has been performed. If no, which is likely in this case, then the next step is to program the cell again at the same $R_d$ level, $R_d$=2. The higher source resistance is for the cells that are slower to program, so it is more likely that the cell will require more than just one programming cycle at that $R_d$ level. If, on the other hand, the maximum number of programming cycles for $R_d$=2 has been reached, then the next step is to increment $R_d$ to $R_d$=3 and make $R_d$ Count=0.

The process of programming in this manner thus continues until either the cell is programmed or the maximum number of programming steps has been performed. The relatively slower approach of using a higher resistance is thus only used when it is necessary to do so. Statistically, a far greater number of cells can be programmed at the lower source resistance. Thus, the vast majority of the programming can be achieved using the high speed approach. This is especially very significant in test time. If, for example, as has been found, that about 99% can be programmed with just one pulse with the source resistor at the low resistance, then only one percent needs more than one pulse. If the higher resistance were used for all of the cells, then programming time for all the cells would go up by a factor of two or more.

This method was described for the situation in which there are three possible choices for the source resistance. There could also be just two resistance values or there could be more than two. If there are only two, then the method is simplified because it is simpler to keep track of which resistance is being used and how many programming pulses for each resistance are allowed. Two is preferable unless three or more is required. Generally also, a memory cell is defective if it cannot be programmed in three pulses total.

The technique utilized resistors, which do offer some benefits, to obtain the desired bias on the sources of the array transistors. This desired bias, however, could be achieved by another means such as an active biasing circuit. The active bias circuit would provide the drain (or source, wherein $R_x$ is $R_s$) bias at a relatively lower voltage for the first programming attempt then a subsequently higher bias to provide needed programming for those that have the excessive leakage on the bit line.

Furthermore, the methods 30 and 50 were described for applying drain voltage. However, the same process can be used for applying a source voltage using source control circuit 148, which mirrors drain control circuit 248. Thus, both source control circuit 148 and drain control circuit 248 can be used with method 50; or alternatively, either the source control circuit 148 or the drain control circuit 248 may be used with the method 50.

In one embodiment, a method for programming a memory device is described, wherein the method comprises selecting a cell to program, wherein the cell is coupled to a bit line, applying a first programming pulse, wherein the first programming pulse comprises applying a first voltage to the bit line, verifying if the cell is programmed after applying the first programming pulse, and applying a second programming pulse to the bit line after applying the first programming pulse if the cell is not programmed after applying the first programming pulse, wherein second programming pulse comprises applying a second voltage to the bit line, wherein the second voltage is different than the first voltage. In one embodiment, the second voltage is less than the first voltage. In one embodiment, applying the first programming pulse and the second programming pulse further comprise applying the first programming pulse and the second programming pulse to the drain of the cell. In one embodiment, the method further comprises verifying if the cell is programmed after applying the second programming pulse, and repeating applying the second programming pulse and verifying if the cell is programmed after applying the second programming pulse until the cell is programmed. In one embodiment, applying the first programming pulse further comprises applying a third voltage to a source of the cell and the second programming pulse further comprises applying a fourth voltage to the source of the cell, wherein the fourth voltage is different than the third voltage. In one embodiment, the fourth voltage is greater than the third voltage. In one embodiment, applying the first programming pulse further comprises applying a fifth voltage to a well of the cell and the second programming pulse further comprises applying a sixth voltage to the well of the cell, wherein the sixth voltage is different than the fifth voltage. In one embodiment, the sixth voltage is greater than the fifth voltage. In one embodiment, applying the first programming pulse further comprises applying a seventh voltage to a gate of the cell and the second programming pulse further comprises applying an eighth voltage to the gate of the cell, wherein the eighth voltage is different than the seventh voltage. In one embodiment, the eighth voltage is greater than the seventh voltage.

In one embodiment, a method for programming a memory cell comprises applying a first programming pulse to a drain of a memory cell with a source of the memory cell at a first voltage level and a drain at a second voltage level, and applying a second programming pulse, after the applying the first programming pulse, to the drain of the memory cell with the source of the memory cell at a third voltage level and the drain at a fourth voltage level, wherein the third voltage level is different than the first voltage level and the fourth voltage level is different than the second voltage level. In one embodiment, the third voltage level is greater than the first voltage level and the fourth voltage level is greater than the second voltage level. In one embodiment, the applying the first programming pulse with the source of the memory cell at the first voltage level and the drain at the second voltage level further includes coupling the source to a circuit with a first resistance level and coupling the drain to a circuit with a second resistance level, and the applying the second programming pulse with the source of the memory cell at the third voltage level and the drain at the fourth voltage level includes coupling the source to a circuit with a third resistance level and coupling the drain to a circuit with a fourth resistance level, wherein the third resistance level is different than the first resistance level and the second resistance level is different than the fourth resistance level. In one embodiment, the first resistance level is substantially the same as the second resistance level and the third resistance level is substantially the same as the fourth resistance level. In one embodiment, the circuit with the first resistance level includes a first resistor circuit, the circuit with the second resistance level includes a second resistor circuit, the circuit with the third resistance level includes the first resistor circuit in series with a third resistive circuit, and the circuit with the fourth resistance level includes the second resistor circuit in series with a fourth resistive circuit. In one embodiment, the first resistance level is lower than the third resistance level and the second resistance level is lower than the fourth resistance level. In one embodiment, the method further comprises applying a third programming pulse, after the applying the second programming pulse, to the drain of the memory cell with the source of the memory cell at a fourth voltage level and the drain of the memory cell at a fifth voltage level. In one embodiment, the applying the first programming pulse further comprises applying a ninth voltage to a well of the memory cell and the second programming pulse further comprises applying a tenth voltage to the well of the memory cell, wherein the tenth voltage is greater than the ninth voltage. In one embodiment, applying the first programming pulse further comprises applying a eleventh voltage to a gate of the memory cell and the second programming pulse further comprises applying a twelfth voltage to the gate of the memory cell, wherein the twelfth voltage is greater than the eleventh voltage.

In one embodiment, a memory comprises: a memory array including a plurality of memory cells, a source bias circuit coupled to sources of the plurality of memory cells, the source bias circuit configured to provide any one of a plurality of source bias voltages to the sources of the plurality of memory cells during a programming pulse applied to a drain of a memory cell of the plurality being programmed, the source bias circuit being responsive to at least one voltage control signal to provide a desired source bias voltage of the plurality of source bias voltages, as indicated by the at least one voltage control signal, to the sources of the plurality of memory cells during a programming pulse applied to a drain of a memory cell of the plurality of memory, and a drain bias circuit coupled to drains of the plurality of memory cells, the drain bias circuit configured to provide any one of a plurality of drain bias voltages to the drains of the plurality of memory cells during a programming pulse applied to a drain of the plurality of memory cells being programmed, the drain bias circuit being responsive to at least one voltage control signal to provide a desired drain bias voltage of the plurality of drain bias voltages, as indicated by the at least one voltage control signal, to the drain a memory cell of the plurality of memory cells during a programming pulse applied to a drain of a memory cell of the plurality of memory cells.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the multiple programming steps can be used to tighten the program $V_t$ distribution, enabling multi-bit storage or 2-bit per cell type of applications. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more. The term "coupled", as used herein, is defined as connected, although not necessarily directly, and not necessarily mechanically.

What is claimed is:

1. A method for programming a memory device, the method comprising:
    selecting a cell to program, wherein the cell is coupled to a bit line;
    applying a first programming pulse, wherein the first programming pulse comprises applying a first voltage to the bit line and a third voltage to a well of the cell;
    verifying if the cell is programmed after applying the first programming pulse; and
    applying a second programming pulse to the bit line after applying the first programming pulse if the cell is not programmed after applying the first programming pulse, wherein the second programming pulse comprises applying a second voltage to the bit line and a fourth voltage to the well of the cell, wherein the second voltage is different than the first voltage and the fourth voltage is greater than the third voltage.

2. The method of claim 1, wherein the second voltage is less than the first voltage.

3. The method of claim 1, wherein applying the first programming pulse and the second programming pulse further comprise applying the first programming pulse and the second programming pulse to a drain of the cell.

4. The method of claim 1, further comprising:
    verifying if the cell is programmed after applying the second programming pulse; and
    repeating applying the second programming pulse and verifying if the cell is programmed after applying the second programming pulse until the cell is programmed.

5. The method of claim 1, wherein applying the first programming pulse further comprises applying a fourth voltage to a source of the cell and the second programming pulse further comprises applying a fifth voltage to the source of the cell, wherein the fifth voltage is different than the fourth voltage.

6. The method of claim 5, wherein the fifth voltage is greater than the fourth voltage.

7. The method of claim 1, wherein applying the first programming pulse further comprises applying a seventh voltage to a gate of the cell and the second programming pulse further comprises applying an eighth voltage to the gate of the cell, wherein the eighth voltage is different than the seventh voltage.

8. The method of claim 7, wherein the eighth voltage is greater than the seventh voltage.

9. The method of claim 2, wherein the second programming pulse uses secondary electron injection with a well bias.

* * * * *